United States Patent
Higuchi et al.

[11] Patent Number: 5,411,601
[45] Date of Patent: May 2, 1995

[54] SUBSTRATE FOR SOLAR CELL AND SOLAR CELL EMPLOYING THE SUBSTRATE

[75] Inventors: Hiroshi Higuchi, Neyagawa; Takashi Arita, Hirakata; Sotoyuki Kitamura, Katano; Mikio Murozono, Hirakata, all of Japan

[73] Assignee: Matsushita Electric Industrial Co., Ltd., Osaka, Japan

[21] Appl. No.: 146,306

[22] Filed: Nov. 2, 1993

[30] Foreign Application Priority Data

Nov. 27, 1992 [JP] Japan ................................ 4-318239

[51] Int. Cl.$^6$ .................... H01L 31/072; H01L 31/18
[52] U.S. Cl. .................................... 136/256; 136/260; 136/264; 136/265; 257/184; 257/200; 257/201; 437/4; 437/5
[58] Field of Search ............... 136/256, 260, 264, 265; 257/184, 200–201; 437/4–5

[56] References Cited

U.S. PATENT DOCUMENTS 5,248,349 9/1993 Foote et al. ....................... 136/260

FOREIGN PATENT DOCUMENTS 2-177377 12/1988 Japan ................................ 136/260

OTHER PUBLICATIONS

N. Nakayama et al, *Jap. J. Appl. Phys*, vol. 19, No. 4, Apr. 1980, pp. 703–712.

*Primary Examiner*—Aaron Weisstuch
*Attorney, Agent, or Firm*—Ratner & Prestia

[57] ABSTRACT

A solar cell is constructed using a heterojunction formed by layering an n-type compound semiconductor followed by a p-type compound semiconductor on an insulator layer containing titanium oxide which has been formed on one side of a glass plate. The insulator layer can improve the photoelectric conversion efficiency of the solar cell by lowering the sheet resistance of the n-type semiconductor film which is used as the window material of the solar cell. In addition, light transmittance is improved.

14 Claims, 3 Drawing Sheets

SUBSTRATE FOR SOLAR CELL AND SOLAR CELL EMPLOYING THE SUBSTRATE

BACKGROUND OF THE INVENTION

FIELD OF THE INVENTION

The present invention relates to a solar cell substrate with an insulator layer containing titanium oxide on one side of a glass plate, and to a compound semiconductor solar cell which includes the substrate.

DESCRIPTION OF THE PRIOR ART

It has been believed that solar cells would become one of the clean energy sources used to solve environmental problems such as global warming, acid rain, destruction of the ozone layer, etc.

Factors in marketing solar cells include improving photo-electric conversion efficiency and reducing cost of the cells. In order to achieve these goals, solar cells using various types of compound semiconductors such as GaAs and InP of Group III-V type, CdS/Cu$_2$S and CdS/CdTe of Group II-VI type and CuInS$_2$ and CuInSe$_2$ of Group I-III-VI$_2$ type, as well as crystalline and amorphous silicon solar cells have been researched and developed. Among the compound semiconductor solar cells, a solar cell using n-CdS/p-CdTe, a compound semiconductor of Group II-VI type, has been put to use on an industrial scale. These cells have advantages such as relatively lower material costs, a conversion efficiency of approximately 10%, and a minimal deterioration of performance over a long period. Furthermore, film forming processes for the compound semiconductor solar cell can be done by printing, drying and sintering or baking. In addition, these cells are suitable for mass production. Also, high voltage solar cells can be formed by using high density wiring on a single glass substrate and by enlarging the surface area.

FIG. 2 shows a cross-section of a typical compound semiconductor solar cell of the II-VI group. In FIG. 2, an n-type semiconductor cadmium sulphide (CdS) film 22, a p-type semiconductor cadmium telluride (CdTe) film 23, a current-collector carbon electrode 24, Ag·In electrode 25 as the positive terminal and an Ag·In electrode 26 as the negative terminal are laminated in order on one side of the glass substrate 21 by repeated screen printing, drying and sintering or baking. The glass substrate has a high light transmittance and electrical insulation.

Omitted from the drawings, however, is a passivation layer which is formed after screen printing and drying. The passivation layer is made of thermosetting resin such as epoxy resin as the main component, which is usually baked on to the elements for protection of the entire device except for the positive and negative terminals on top of the Ag·In electrodes. A copper paste is screen printed, dried, and baked on the Ag·In electrodes so that lead wires are easily soldered.

Light, including sun light, enters the glass substrate 21, as shown in FIG. 2. Electricity is then generated through a photo-electric conversion process.

Common soda-lime glass having a low softening point cannot be used for the glass substrate because a high sintering temperature is used to apply the compound semiconductor film. Currently, barium borosilicate glass, which is a heat-resistant glass with superior characteristics such as a high softening point, is widely used in industry.

It is known in principle that if monovalent alkali metals are contained within the glass substrate the performance of a solar cell decreases because the monovalent alkali metals diffuse into the CdS layer of the n-type semiconductor, causing the sheet resistance to increase. Thus, barium borosilicate glass containing a low content of alkali metal atoms is selected for the substrate. Barium borosilicate glass, however, usually contains approximately 0.1 wt % of Na$_2$O which contributes to the degradation in performance of the compound semiconductor solar cell caused by alkali metal atoms.

As one possible means to improve the photoelectric conversion efficiency of the solar cell, it has been suggested that the light transmittance be increased in order to increase the amount of incidence light. FIG. 7 shows a typical view made from a cross-sectional photograph taken with a scanning electron microscope (SEM). FIG. 7 shows a CdS film as an n-type semiconductor formed on a substrate of barium borosilicate glass plate using printing, drying and sintering. The CdS particles in the sintered CdS film 72 on substrate 71 are not bonded as an integrated and continuous film on the substrate 71, therefore many vacant spaces 73 are left. Improvement in the film's characteristics, such as light transmittance, is expected if the CdS film is bonded better so the vacant spaces are reduced or eliminated.

SUMMARY OF THE INVENTION

The present invention relates to an improvement of film characteristics, such as light transmittance, by controlling the degradation of the solar cell element. Particularly, degradation of the CdS film, as an n-type semiconductor, caused by the small amounts of alkali metal atoms contained in the conventional barium borosilicate glass plate and the incomplete bonding of the n-type semiconductor film on the substrate. The improvement in the light-electric conversion efficiency of the solar cell using the above substrate is accomplished by using an insulator layer made of titanium oxide or a mixture of titanium oxide and silicon oxide formed on one side of the barium borosilicate glass plate. This improves the CdS film characteristics of an n-type semiconductor.

DESCRIPTION OF THE PREFERRED EMBODIMENTS

First, the production process for making the substrate of a compound semiconductor solar cell is described below using examples.

EXAMPLE 1

An insulator layer including titanium oxide is formed on one side of a barium borosilicate glass plate. The barium borosilicate glass is used as the glass substrate for compound semiconductor solar cells. The insulator layer is formed using a 99% pure titanium dioxide ($TiO_2$) powder as the supply source. The insulator layer is deposited using the electron beam vapor deposition method. 100 Å/min. was chosen for the vapor deposition rate.

EXAMPLE 2

In a second exemplary embodiment, an insulator layer including a mixture of titanium oxide and silicon oxide is formed on one side of a barium borosilicate glass plate, using the electron beam vapor deposition method. $TiO_2$ and silicon dioxide ($SiO_2$) powder, both 99% in purity, were used as the supply source. The two source vapor deposition method was used. Both vapor deposition rates were controlled to 50 Å/min.

EXAMPLE 3

In a third exemplary embodiment, 60 wt % titanium alkoxide and 40 wt % silicon alkoxide are dissolved in a solvent with ethanol as the main component to make a solution. Next, the aforementioned solution is coated thinly on one side of a barium borosilicate glass plate using a spin coating method. Then the insulator layer including the mixture of titanium oxide and silicon oxide is dried at 150° C. and burned at 500° C. for 1 hour.

The electron beam vapor deposition method employed in both Examples 1 and 2 is a dry method requiring no processing afterwards such as rinsing or drying. Thus, this method is suitable for studying the mix ratio of titanium oxide and silicon oxide, and also for producing a solar cell substrate of small surface area. However, the spin coating method described in Example 3 is more advantageous for the mass production of solar cell substrates of large surface area.

Figure 1:
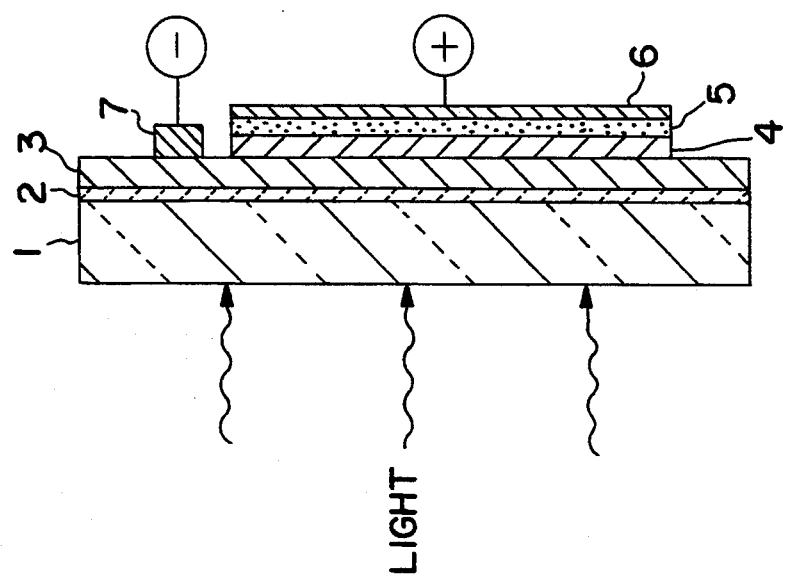
FIG. 1 is a cross-sectional view of the compound semiconductor solar cell of an exemplary embodiment of the invention.

FIG. 1 shows a cross-section of a Group II-VI compound semiconductor solar cell in accordance with an exemplary embodiment of the present invention. An exemplary process for manufacturing this device is described below. The insulator layer 2 including a mixture of titanium oxide and silicon oxide is formed on one side of a barium borosilicate glass plate 1 as described in Example 3 to obtain a substrate. The solution used in the spin coating method is 50% by wt titanium alkoxide and 50% by wt silicon alkoxide. An n-CdS/p-CdTe solar cell is then formed on the insulator layer of the substrate using a conventional method. For example, cadmium chloride as a flux and propylene glycol (PG) as a viscous agent are added to CdS powder to make a paste. The paste is printed in a pattern using a screen printing method. The pattern is sintered at 690° C. after drying to obtain the CdS film 3. Then the same paste containing $CdCl_2$ and PG is mixed with a powder of cadmium and tellurium. This mixture is then screen printed, dried, and sintered at 620° C. to form the CdTe film 4.

A carbon paste is screen printed, dried, and baked to form carbon film 5. The carbon film becomes the current-collector electrode for the p-type semiconductor CdTe film 4 which forms the heterojunction of n-CdS/p-CdTe. Then a mixed powder paste of silver and indium is screen printed, dried, and sintered in the same manner to form Ag·In electrodes 6 and 7, which are the terminals for the positive and negative electrodes respectively. In the same manner as the cross-sectional drawing of a conventional solar cell shown in FIG. 2, copper paste is screen printed, dried, and baked on to both Ag·In electrodes 6 and 7 for soldering lead wires which are omitted in the drawing. Then a passivation coating is formed by screen printing, drying, and baking to complete the solar cell. This layer is not formed on the areas of the Ag·In electrodes 6 or 7 which were covered by the copper paste. The sintering and baking in each process was performed in a nitrogen atmosphere.

Figure 2:
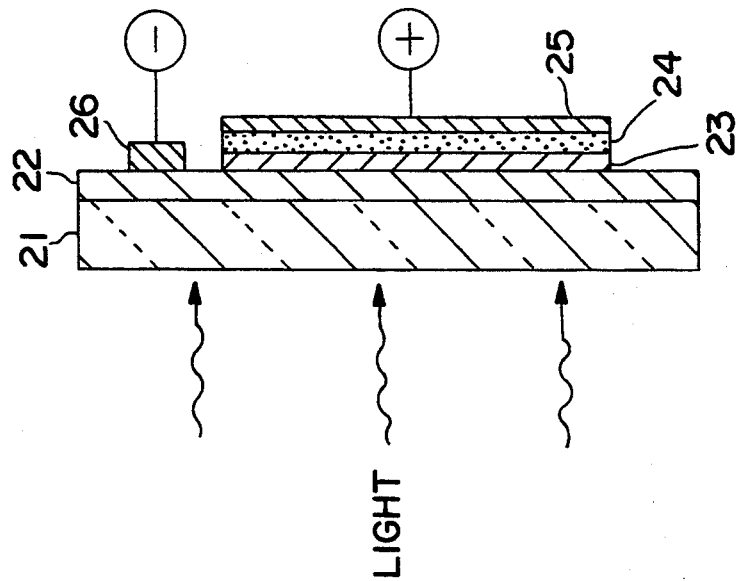
FIG. 2 is a cross-sectional view of a conventional Group II-VI type compound semiconductor solar cell.

The conventional n-CdS/p-CdTe system solar cell shown in FIG. 2 was manufactured by a similar process and conditions as disclosed above except a conventional barium borosilicate glass was used for the substrate. The photo-electric conversion efficiency of these solar cells was measured using solar spectral light with an intensity of 100 $mW/cm^2$. The results are shown in Table 1.

TABLE 1

| CELL | Short Circuit Current Density ($mA/cm^2$) | Open Circuit Voltage (V) | Fill Factor | Intrinsic Photoelectric Efficiency (%) |
|---|---|---|---|---|
| Conventional (A) | 18.8 | 0.770 | 0.62 | 9.0 |
| Exemplary Embodiment (B) | 20.4 | 0.776 | 0.66 | 10.4 |

As indicated in Table 1, the solar cell of the exemplary embodiment of the present invention (B) is superior to the conventional cell (A) in open circuit voltage, fill factor, and short circuit current density. As a result, the intrinsic photo-electric conversion efficiency is highly improved.

In order to determine the reasons for the improvement, the substrate was studied, and various analyses of the CdS film of the n-type semiconductor were performed. The results of the analysis are discussed below.

Figure 3:
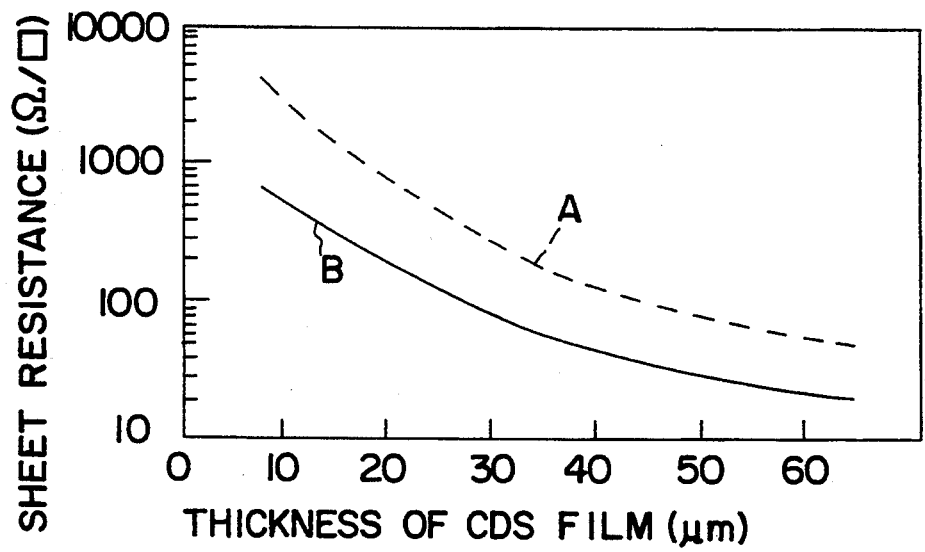
FIG. 3 is a graph comparing the sheet resistance for the CdS film, as an n-type compound semiconductor on a conventional substrate to that of an exemplary embodiment of the present invention.

First, the sheet resistance for various thicknesses of CdS films formed on a conventional substrate were compared to that of the exemplary embodiment of the invention, as shown in FIG. 3. The dashed line A and solid line B in FIG. 3 indicate the conventional substrate and that of the invention, respectively. FIG. 3 shows that the sheet resistance of CdS films formed on the substrate of the exemplary embodiment decreased to approximately 1/4 that of the conventional substrate. It is assumed that this decrease of sheet resistance may cause the improvement in short circuit current density and fill factor.

Figure 4:
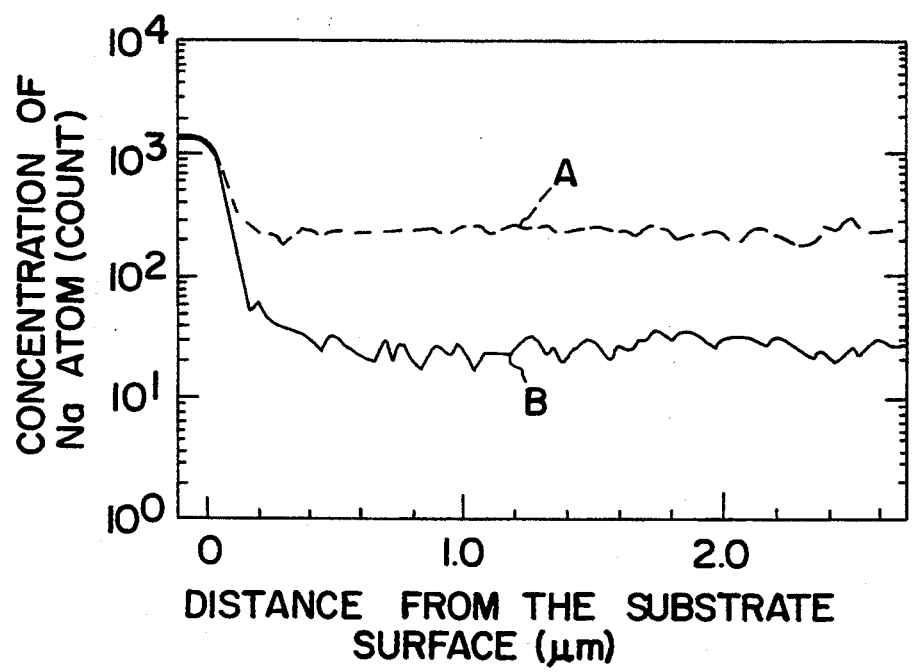
FIG. 4 is a graph comparing the concentration distribution of the sodium atoms diffused into the CdS film on a conventional substrate to that of the exemplary embodiment of the present invention.

FIG. 4 shows a comparison between the concentration distribution of sodium atoms diffusing into the CdS films on a conventional substrate to that of the exemplary embodiment. FIG. 4 indicates that the concentration of sodium atoms diffusing into CdS films on the substrate of the exemplary embodiment (B) is approximately one order of magnitude lower than that of the conventional substrate (A). It is assumed that the formation of an insulator layer consisting of a mixture of titanium oxide and silicon oxide on a barium borosilicate glass plate as in the exemplary embodiment of the present invention may lower the concentration of monovalent sodium atoms diffusing into the CdS film. Consequently, this may increase the open circuit voltage of the solar cell. The concentration of sodium atoms was measured using a secondary ion mass spectrometer (SIMS).

Figure 5:
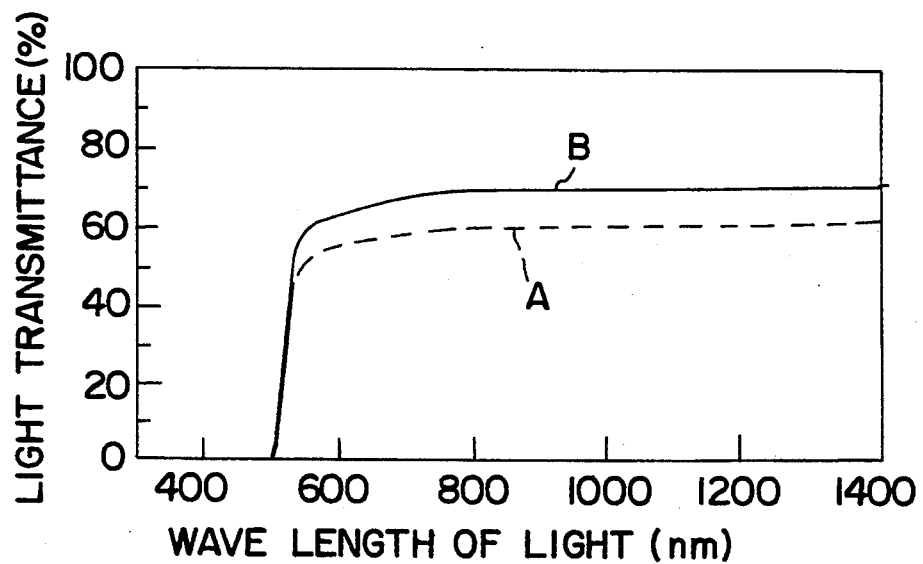
FIG. 5 is a graph comparing the light transmittance of the CdS film on a conventional substrate to that of an exemplary embodiment of the present invention.

FIG. 5 shows the results of the light transmittance measurements of the CdS films formed on the conventional substrate and that of the exemplary embodiment as a function of wavelength. FIG. 5 indicates that the light transmittance of the CdS film (B) of the exemplary embodiment was increased approximately 10% for wavelengths in the 515–600 nm range, and approximately 15% for wavelengths in the 600–900 nm range over the conventional CdS film (A), These results may suggest that a solar cell employing the substrate of the present invention will increase the photocurrent by at least 10% over the conventional solar cell.

Figure 6:
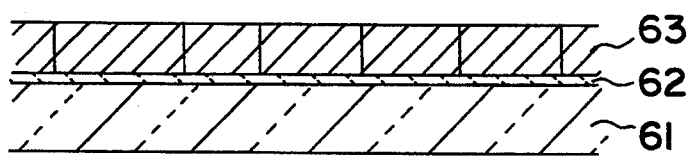
FIG. 6 is a cross-sectional typical view of the CdS film formed on a substrate in accordance with an exemplary embodiment of the present invention, as determined from a SEM photograph.
Figure 7:
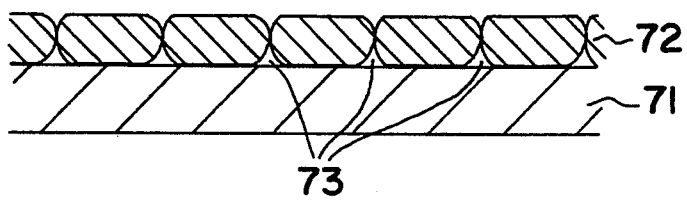
FIG. 7 is a typical cross-sectional view of the conventional CdS film formed on a substrate made from a SEM photograph.

FIG. 6 shows a typical view made from a cross-sectional SEM photograph of the CdS film of the exemplary embodiment of the present invention. No vacant spaces between the substrate and CdS film were observed as were observed with the conventional CdS film shown in FIG. 7. In other words, when the n-type semiconductor CdS film 63 is formed on the substrate in accordance with the exemplary embodiment of the present invention by first forming the insulator layer 62 which comprises a mixture of titanium oxide and silicon oxide on one side of the barium borosilicate glass plate 61 and then forming the CdS film 63, the insulator layer 62 and the CdS film 63 became bonded and the CdS particles are completely sintered, thereby creating a continuous film. It is considered possible that the eutectic liquid of CdS and $CdCl_2$ formed during CdS film sintering makes better contact to the insulator layer of the substrate of the exemplary embodiment than the conventional substrate. This causes the $CdCl_2$ flux to evaporate, and the dense CdS film to be separated.

As noted above, use of a substrate produced by forming an insulator layer consisting of titanium oxide and silicon oxide on one side of a glass plate as in the exemplary embodiment prevents alkali metal atoms such as sodium in the glass from diffusing into the CdS film. Therefore the CdS film sheet resistance is lowered from the complete bonding of the substrate and the CdS film. Furthermore, the CdS film characteristics such as light transmittance are improved. As a result, it is considered that the open circuit voltage, fill factor, and short circuit current density also increase, consequently substantially increasing the photo-electric conversion efficiency of the device.

The insulator layer, in accordance with the present invention, may include titanium oxide alone or a mixture of titanium oxide and silicon oxide, and the mixture should contain an equal or greater weight of titanium oxide over silicon oxide. In addition, although CdS was used as the main component of the n-type semiconductor film, the p-type semiconductor is not limited only to the CdTe film used in the exemplary embodiments.

Furthermore, Group I-III-VI$_2$ semiconductors having $CuInSe_2$ as the main component provided equivalent results.

In addition, the insulator layer containing titanium oxide should be placed only on one side of the glass plate to form a solar cell element by establishing an n-type semiconductor CdS film on the insulator layer.

The reason the insulator layer should not be formed on the opposite side of the solar cell element is that the insulator layer would reflect incident light, thereby degrading the light transmittance.

Even though only the use of barium borosilicate glass has been described in the exemplary embodiments, and which generally has an extremely low alkali metal content, other materials with a higher alkali metal atom content can be used for the solar cell substrate by forming an insulator layer.

While the invention has been described in terms of an exemplary embodiment, it is contemplated that it may be practiced as outlined above with modifications within the spirit and scope of the appended claims.

What is claimed:

1. A solar cell comprising:
    a glass plate having at least one side;
    an insulator layer formed on said one side of said glass plate, said insulator layer comprising titanium oxide; and
    a compound semiconductor formed in contact with said insulator layer.

2. A solar cell as in claim 1, wherein said insulator layer includes a mixture of titanium oxide and silicon oxide.

3. A solar cell as in claim 2, wherein said insulator layer contains by weight an amount of titanium oxide which is equal to or greater than the amount of silicon oxide in said insulator layer.

4. A solar cell as in claim 3, wherein said glass plate is comprised of barium borosilicate glass.

5. A solar cell as in claim 2, wherein said glass plate is comprised of barium borosilicate glass.

6. A solar cell as in claim 1, wherein said glass plate is comprised of barium borosilicate glass.

7. A method for manufacturing a solar cell comprising:
    providing a glass plate having at least one side;
    forming an insulator layer comprising titanium oxide on one side of said plate;
    forming a heterojunction in contact with said insulator layer by laminating an n-type compound semiconductor film and a p-type compound semiconductor film on said insulator film.

8. A method of manufacturing a solar cell as in claim 7, wherein said insulator layer includes a mixture of titanium oxide and silicon oxide.

9. A method of manufacturing a solar cell as in claim 8, wherein said insulator layer contains an equal or a greater amount by weight of titanium oxide than silicon oxide.

10. A method of manufacturing a solar cell as in claim 9, wherein said glass plate comprises barium borosilicate glass.

11. A method of manufacturing a solar cell as in claim 8, wherein said glass plate comprises barium borosilicate glass.

12. A method of manufacturing a solar cell as in claim 7, wherein said glass plate comprises barium borosilicate glass.

13. A method of manufacturing a solar cell as in claim 7, wherein of said n-type compound semiconductor film comprises CdS.

14. A method of manufacturing a solar cell as in claim 7, wherein said p-type compound semiconductor film comprises at least one material selected from the group consisting of CdTe and $CuInSe_2$.

* * * * *